(12) United States Patent
Kamp et al.

(10) Patent No.: US 6,201,731 B1
(45) Date of Patent: Mar. 13, 2001

(54) ELECTRONIC MEMORY WITH DISTURB PREVENTION FUNCTION

(75) Inventors: David A. Kamp, Monument; Gary F. Derbenwick, Colorado Springs; George B. Coombe, Colorado Springs; Troy A. Meester, Colorado Springs, all of CO (US)

(73) Assignee: Celis Semiconductor Corporation, Colorado Springs, CO (US)

( * ) Notice: Subject to any disclaimer, the term of this patent is extended or adjusted under 35 U.S.C. 154(b) by 0 days.

(21) Appl. No.: 09/322,490

(22) Filed: May 28, 1999

(51) Int. Cl.[7] .................................................... C11C 16/04
(52) U.S. Cl. ................... 365/185.02; 365/145; 365/192; 365/65; 365/194
(58) Field of Search .............................. 365/185.02, 145, 365/192, 65, 194

(56) References Cited

U.S. PATENT DOCUMENTS

| | | |
|---|---|---|
| 2,876,436 | 3/1959 | Anderson . |
| 4,873,664 | 10/1989 | Eaton, Jr. . |
| 4,888,733 | 12/1989 | Mobley . |
| 5,029,128 | 7/1991 | Toda . |
| 5,406,510 | 4/1995 | Mihara et al. . |
| 5,574,679 | * 11/1996 | Ohtsuki et al. ...................... 365/145 |
| 5,892,712 | * 4/1999 | Hirose et al. ................... 365/185.07 |
| 5,963,473 | * 10/1999 | Norman ........................... 365/185.02 |

OTHER PUBLICATIONS

Koike et al., "A 60–ns 1–Mb Nonvolatile Ferroelectric Memory with a Nondrive Cell Plate Write/Read Scheme," IEEE Journal of Solid–State Circuits, vol. 31 (No. 11), pp. 1625–1634 (Nov., 1996).
Auciello et al., "The Physics of Ferroelectric Memories," Physics Today, American Institute of Physics (Woodbury, NY), vol. 51 (No. 7), pp. 22–27 (Jul. 1998).

* cited by examiner

Primary Examiner—David Nelms
Assistant Examiner—Connie C. Yoha
(74) Attorney, Agent, or Firm—Duft, Graziano & Forest, P.C.

(57) ABSTRACT

A ferroelectric destructive read-out memory system includes a power source, a memory array including a memory cell, and a logic circuit for applying a signal to the memory array. Whenever a low power condition is detected in said power source, a disturb prevent circuit prevents unintended voltages due to the low power condition from disturbing the memory cell. The disturb prevent circuit also stops the operation of the logic circuit for a time sufficient to permit a rewrite cycle to be completed, thereby preventing loss of the data being rewritten.

45 Claims, 6 Drawing Sheets

ELECTRONIC MEMORY WITH DISTURB PREVENTION FUNCTION

BACKGROUND OF THE INVENTION

1. Field of the Invention

The invention in general relates to destructive readout electronic memories, in particular ferroelectric memories, and more particularly to such a memory in which the data cannot be disturbed during power-up, power-down, brownouts and other sub-unstable electronic conditions.

2. Statement of the Problem

Ferroelectric memories are becoming commercially important because they are nonvolatile, can be made at relatively low cost, and can be written to and read at voltages and speeds typical of conventional DRAM and SRAM computer memories; that is, at voltages of from 1 to 5 volts in times of the order of 10 to 100 nanoseconds. See, for example, Orlando Auciello, James F. Scott, and Ramanmoorthy Ramesh, "The Physics of Ferroelectric Memories", Physics Today, Vol. 51, No. Jul. 7, 1998, pp. 22–27. However, these advantages also lead to problems with the memories as compared to other nonvolatile memories. Conventional nonvolatile memories, such as EPROMs, can be written to only by applying relatively high voltages, i.e. 15 volts, for relatively long periods, i.e. 100 microseconds to 200 microseconds. Thus, once they are programmed, the data of EPROMs and other non-ferroelectric nonvolatile memories cannot be disturbed by voltages at which conventional computers operate. However, since ferroelectric memories can be rewritten by relatively short, relatively low voltage pulses, stray voltages, such as can occur during power-up, power-down, and other non-optimal electronic conditions can cause the loss of data.

Most nonvolatile memories, such as EPROMs, EEPROMs, and flash memories, are non-destructive readout memories. In destructive readout volatile memories, such as DRAM, it does not matter whether the data is disturbed on power-up or power-down because, due to their volatility, the systems they are used in expect that data will be lost on power-down.

Present commercial ferroelectric memories utilize a ferroelectric capacitor as the storage medium and an electric field must be placed across the storage capacitor to read it. This reading electric field can alter the state of the memory cell. Thus, ferroelectric memories are destructive read-out memories. See, for example, the memories described in U.S. Pat. No. 5,029,128 issued Jul. 2, 1991 to Haruki Toda, and U.S. Pat. No. 5,406,510 issued Apr. 11, 1995 to Takashi Mihara et. al. Such destructive read-out memories include a rewrite function in which the data read out is restored to the memory cell immediately after it is read. The rewrite function takes time, and if the memory function is truncated, such as by a power loss, while or immediately after a cell is read and before the rewrite cycle can be completed, the data for that cell will be lost. Such data loss is not acceptable for nonvolatile memories. Most commercial memories include power-off and power-on reset functions. The power-off function shuts the system down when the power drops to or below a predetermined voltage, which voltage we shall refer to as the "OFF threshold" voltage. The power-on-reset function resets latches and other resettable circuits when the power rises to or above a predetermined voltage, which voltage we shall refer to as the "ON threshold" voltage. A brownout is an electrical occurrence in which the power drops below the OFF threshold voltage and then immediately comes back up to the ON threshold voltage. If a brownout occurs just as a memory cell is being read and is very short, the power-on-reset function can occur before the rewrite function is finished. In this case, the latches or other multiple state devices that are holding the data to be rewritten can be reset before the data is rewritten. If this occurs, data will be lost. Similarly, data can be lost in other instances when a destructive read-out electronic memory is reset or addressed due to some other non-optimum condition while a memory cell is being read or being rewritten. Brownouts and other unstable conditions that can result in the loss of data occur frequently in certain types of ferroelectric memories. For instance, one important application of ferroelectric memories is in contactless radio frequency identification (RFID) cards. If such an RFID card is being held in a fringe reception area, a number of brownout conditions can occur in a short time leading to loss of significant data.

For the above reasons, it would be highly desirable to have a ferroelectric, destructive read-out electronic memory such that sub-optimum electronic conditions, such as occur on power-up, power-down, and brownouts, cannot cause a loss of data.

3. Solution to the Problem

The present invention solves the above problem by providing a disturb prevention circuit and method that prevents unstable power conditions from disturbing data in the memory cells of a memory system.

In one embodiment, the disturb prevention circuit holds conducting lines in the memory to predetermined voltage states during power-up, power-down, brownouts, and other non-optimal electronic conditions. These predetermined voltage states are such that the probability of data being disturbed at these times is significantly reduced. Preferably, the disturb prevention circuit holds the conducting lines that can carry voltages that can disturb the memory cell at the same voltage, preferably ground, during power-up and power-down.

In another embodiment of the invention, the disturb prevention circuit comprises a delay circuit that delays application of power to the memory array until the control logic is powered up.

In a further embodiment of the invention, the disturb prevention circuit disables a control signal to the memory until the control logic is in a stable electronic state.

In still another embodiment, for a time sufficient to complete the rewrite function, the disturb prevention circuit pauses the logic circuitry that applies signals to the memory array.

In yet another embodiment, a data element holding the data to be rewritten to the memory is frozen for a time sufficient to complete the rewrite function.

The invention provides a destructive readout, nonvolatile memory system comprising: a power source for applying electrical power to the memory system; a destructive readout, nonvolatile memory cell for holding data; and a disturb prevention circuit for preventing the data from being disturbed during a period when the electrical power is unstable.

The invention also provides a ferroelectric memory system comprising: a power source for applying electrical power to the memory system; a memory cell for holding data, the memory cell including a ferroelectric material; and a disturb prevention circuit for preventing the data from being disturbed during a period when the electrical power is unstable. Preferably, the period is selected from the group consisting of a power-up period, a power-down period, and a brownout period. Preferably, the disturb prevention circuit comprises a circuit for preventing disturb voltages from being applied to the memory cell during the period. Preferably, the memory includes: a circuit for reading the data and rewriting the data to the memory cell after it has been read; and the disturb prevention circuit comprises a circuit for preventing loss of the data before it is rewritten. Preferably, the memory includes a conductor directly electrically connected to or directly electrically connectable to the memory cell, and the disturb prevention circuit comprises a clamping circuit for clamping the conductor to a predetermined voltage. Preferably, there are two of the conductors, the two of the conductors comprise a bit line and a word line, and the disturb prevention circuit comprises a circuit for clamping the word line and the bit line to the predetermined voltage. Preferably, the voltage is the memory system ground. Preferably, the memory cell is part of an array of memory cells, the memory system further includes a logic circuit for applying signals to the array of memory cells and a power supply for applying power to the logic circuit and the memory array, and the disturb prevention circuit comprises a circuit for applying power to the logic circuit prior to applying power to the memory array. Preferably, the memory cell is part of an array of memory cells, the memory system further includes a logic circuit for applying signals to the array of memory cells and a power supply for applying power to the logic circuit and the memory array, and the disturb prevention circuit comprises a delay circuit for delaying the application of power from the power supply to the memory array for a period of time sufficient to permit the logic circuit to become operational before power is applied to the memory array. Preferably, the memory system comprises an electrical line for applying a control signal within the memory system and the disturb prevention circuit comprises a disable circuit for disabling the control signal for a predetermined time. Preferably, the period is a power-up period and the predetermined time includes the power-up period. Alternatively, the period is a power-down period and the predetermined time includes the power-down period. Preferably, in another alternative, the period is a brownout period and the predetermined time includes the brownout period. Preferably, the memory includes logic for applying a voltage signal to the memory cell, the period is a power-up period, and the predetermined time is a time sufficient to permit the logic to become operational. Preferably, the disable circuit includes a one-shot pulse generator circuit. Preferably, the disable circuit includes a latch. Preferably, the memory includes a logic circuit and the disable circuit includes a reset circuit for producing a reset signal for resetting the logic circuit. Preferably, the memory comprises a radio frequency identification card memory. Preferably, the memory includes a memory array and a logic circuit for applying a signal to the memory array, the cell is part of the memory array, and the disturb prevention circuit comprises a pause circuit for producing a pause signal for causing the logic circuit to pause during a predetermined time. Preferably, the logic circuit includes a timing generator responsive to the pause signal for pausing during the predetermined time. Preferably, the period is a brownout period and the predetermined time includes the brownout period. Preferably, the memory includes: a circuit for reading the data and rewriting the data to the memory cell after it has been read; and the predetermined time comprises a time sufficient to complete the rewriting of the data. Preferably, the disturb prevention circuit comprises a circuit for providing a freeze signal. Preferably, the memory includes a memory array and the memory cell is part of the memory array, the memory further includes a data storage element for holding data to be rewritten to the memory array, and a freeze circuit responsive to the freeze signal for preventing the state of the data storage element from changing.

In another aspect, the invention provides a ferroelectric memory system comprising: a memory cell; and a disturb prevention circuit for preventing disturb voltages from being placed on the memory cell during a period selected from the group consisting of a power-up period, a power-down period, and a brownout period.

In another aspect, the invention provides a destructive readout memory system comprising: a destructive readout memory cell; and a disturb prevention circuit for preventing disturb voltages from being placed on the memory cell during a period selected from the group consisting of a power-up period, a power-down period, and a brownout period. Preferably, the condition is selected from the group consisting of a power-up condition, a power-down condition, a brownout condition. Preferably, the condition is selected from the group consisting of the power-down condition and the brownout condition; the memory system comprises a logic circuit for writing, reading, and rewriting data into the memory cell; and the disturb prevention circuit comprises a circuit communicating with the logic circuit for preventing the rewriting of the data from being disturbed due to the condition.

In a further aspect, the invention provides a ferroelectric memory system comprising: a power source for applying electrical power to the memory system; a memory cell for holding data, the memory cell including a ferroelectric material; and a disturb prevention circuit for preventing the data from being disturbed due to a condition in which the electrical power is unstable. Preferably, the condition is elected from the group consisting of a power-up condition, a power-down condition, brownout condition. Preferably, the condition is selected from the group consisting the power-down condition and the brownout condition; the memory system comprises a logic circuit for writing, reading, and rewriting data into the memory cell; and the disturb prevention circuit comprises a circuit communicating with the logic circuit for preventing the rewriting of the data from being disturbed due to the condition. Preferably, the logic circuit includes a data storage device for storing data to be rewritten into the memory cell, and the disturb prevention circuit comprises a circuit for preventing the loss of the data in the data storage device due to the condition. Preferably, the power source comprises a source of a voltage; the memory system further includes a memory array and the memory cell is part of the memory array; the memory system further includes a logic circuit for applying an electrical signal to the memory array and a power-on-reset circuit for resetting the logic circuit when the voltage drops below an OFF threshold then rises to an ON threshold; and the disturb prevention circuit comprises a circuit for preventing the resetting of the logic circuit from causing loss of the data. Preferably, the source of a voltage includes a circuit for producing the voltage from a radio frequency source. Preferably, the logic circuit includes a timing signal generator and the disturb prevention circuit comprises a pause signal generating circuit for generating a pause signal for preventing the timing signal generator from outputting signals that could result in loss of the data. Preferably, the pause signal generating circuit comprises a circuit for generating the pause signal for a predetermined time. Preferably, the logic circuit includes a state machine and the disturb prevention circuit comprises a circuit for inhibiting the state machine from outputting signals that could result in loss of the data. Preferably, the memory system includes a data storage element and a freeze circuit for freezing the data content of the data storage element while a predetermined signal is applied to the freeze circuit. Preferably, the disturb prevention circuit consists essentially of transistors, inverters, and other electronic elements that operate reliably at voltages significantly less than the supply voltage of the memory system. Preferably, the memory system further includes a circuit for producing a system supply voltage from a radio frequency source. Preferably, the disturb prevention circuit comprises a circuit for preventing disturb voltages from being applied to the memory cell due to the condition.

In still another aspect, the invention provides a method of operating a destructive readout, nonvolatile memory having a memory cell in which data is stored, the method comprising the steps of: sensing a low power condition of the memory; and preventing unintended voltages produced by the low power condition from disturbing the data in the memory cell.

The invention also provides a method of operating a ferroelectric memory having a memory cell in which data is stored, the method comprising the steps of: sensing a low power condition of the memory; and preventing unintended voltages produced by the low power condition from disturbing the data in the memory cell. Preferably, the memory includes a conductor directly connected to or directly connectable to the memory cell and the step of preventing comprises clamping the conductor to a predetermined voltage. Preferably, the memory includes a logic circuit for applying a logic signal to the memory cell, and a memory array, the memory cell being part of the memory array; and the step of preventing comprises directing power to the logic circuit, and then after the logic circuit has reached an operating voltage, directing power to the memory array. Preferably, the step of preventing comprises: receiving a memory control signal; and disabling the memory signal for a time period in which the low power condition could cause the unintended voltages. Preferably, the memory includes a logic circuit for applying a signal to the memory cell, and the step of preventing comprises stopping the operation of the logic circuit for a time period in which the low power condition could cause the unintended voltages.

In another aspect, the invention provides a method of operating a destructive read out memory having a destructive readout memory cell in which data is stored, the method comprising the steps of: reading the data in the memory cell; rewriting the data to the memory cell; sensing a low power condition in the memory; and preventing the low power condition from disturbing a step selected from the group consisting of the reading step and the rewriting step. Preferably, the memory includes a logic circuit, and the step of preventing comprises freezing the logic circuit for a time sufficient to complete the rewriting the data to the memory cell.

In addition, the invention provides a method of operating a ferroelectric memory having a ferroelectric memory cell in which data is stored, the method comprising the steps of: reading the data in the ferroelectric memory cell; rewriting the data to the ferroelectric memory cell; sensing a low power condition in the memory; and preventing the low power condition from disturbing a step selected from the group consisting of the reading step and the rewriting step. Preferably, the memory includes logic circuit, and the step of preventing comprises freezing the logic circuit for a time sufficient to complete the rewriting the data to the memory cell.

The memory according to the invention not only prevents loss of data during power-up, power-down, brownouts and other non-optimum operating conditions, but also does this simply and economically and without introducing further potential data loss mechanisms into the memory system. Numerous other features, objects and advantages of the invention will become apparent from the following description when read in conjunction with the accompanying drawings.

DESCRIPTION OF THE PREFERRED EMBODIMENT

1. Overview

Figure 1:
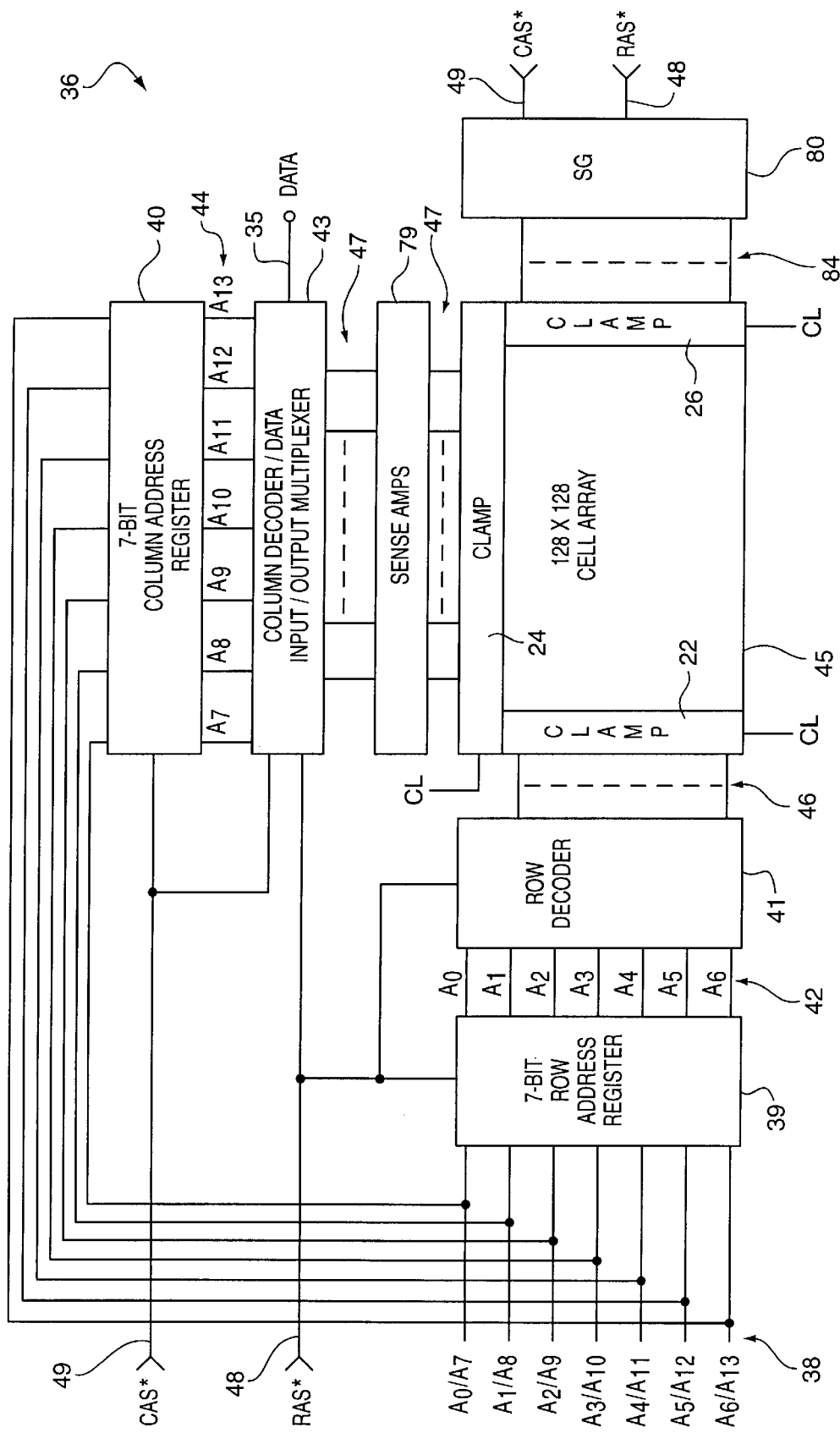
FIG. 1 is a schematic diagram of one preferred embodiment of a memory according to the invention.

The invention relates to the use of a disturb prevention circuit in a destructive read out ferroelectric memory and a method of operation of a ferroelectric memory to prevent disturbance causing the loss of data in memory cells during periods of unstable electric power. Embodiments of ferroelectric memories are shown at 36, 500, 600, 1000, and 1 100 in FIGS. 1, 5, 6, 10, and 11, respectively. Embodiments of the disturb prevention circuit are shown at 22, 24, 26, 540, 620, 1020, and 1120 in FIG. 1 (22, 24, 26), FIGS. 3 and 4 (24), FIG. 5 (540), FIGS. 6 and 7 (620), FIG. 10 (1020) and FIG. 11 (1120), respectively. Every ferroelectric memory includes a power source (1018, 1118), though this is not shown in all embodiments, and, when shown, is shown only generally, since the power source is conventional. Every ferroelectric memory also includes an array (45, 530, 1011, 1111) of memory cells (220, 1013, 1113), although the array and the cells are also usually shown only generally since they too are conventional. A typical memory cell 220 and its place in an array 45 of cells is shown in detail in FIG. 2.

A period of unstable electric power is defined as a period in which one or more logic elements in the memory have a significant probability of not operating as they were designed to due to fluctuating or low power. A probability is significant in this sense, if the probability of not operating properly is such that it would cause an unacceptable loss of data. Generally, a loss of one bit of data in $1 \times 10^7$ device hours, i.e. 100 FITs (a FIT is one failure in one billion device hours), is unacceptable.

Typical conditions under which power is unstable are power-up, power-down and brownouts. A brownout is a condition in which power drops below a threshold at which one or more logic elements of a memory may not opera as they were designed to, and then returns above the threshold without complete loss of power. The periods over which such conditions exist can be defined in terms of the supply voltage, Vdd, versus time curve shown in FIG. 8. The power-up period 820 is defined as any portion of the period from point 801 where power is turned on to the point where all electrical elements in the memory are operating as they are designed to, which is indicated qualitatively at point 822 in FIG. 8. Preferably, the power-up period includes both a portion prior to point 821 where Vdd has reached the full supply voltage and a portion after this point. Most preferably, it includes the entire period from "ON" threshold 803 until point 822 where all electrical elements in the memory are operating as they are designed. Brownout period 830 is defined as any portion of the period from time 805 where the power reaches an "OFF" threshold to the time, qualitatively indicated at 808, where all electrical elements in the memory are again operating as they are designed to. Preferably, it includes the portion between time 805 where the "OFF" threshold is reached and time 831 where the "ON" threshold is reached. Most preferably, it includes the entire portion between time 805 where the "OFF" threshold is reached and time 832 where all electrical elements in the memory are again operating as they are designed to. Note that both power-up period 820 and brownout period 830 can include times when Vdd is at full voltage, since many electrical elements will not function properly until they have been at or near full voltage for some minimum time. Power-down period 840 is defined as any portion of the period from time 810 where the power reaches the "OFF" threshold to time 811 where the power is completely off. Preferably, it includes both a portion between the time the "OFF" threshold is reached and the period after the time, shown qualitatively at 841, where all electronics in the memory has ceased operating as it was designed. Most preferably, it includes the entire period between time 810 where the "OFF" threshold is reached to time 811 when the power has fallen to zero.

The disturb prevention circuit is designed to prevent any loss of data during periods of unstable power. While there are many ways data can be lost in a ferroelectric memory in unstable power conditions, these can generally be classified under two main headings: 1) instances in which unintended voltages are placed on a memory cell; and 2) instances where the rewrite function is not completed properly.

To prevent unintended voltages from being placed on a memory cell, the invention operates at one or more of three different levels. At the lowest level, it operates to prevent stray voltages from being placed on conducting lines that are directly electrically connected to the memory storage element, such as capacitor 232 in FIG. 2, or are directly electrically connectable to memory storage element 232. Here, directly electrically connected means that any voltage applied to the conductor is also applied to the memory element. Plate line 212 is directly electrically connected to memory element 232, but line 218 is not. Directly electrically connectable means that by closing a switch or equivalent electrical element, any voltage applied to the conductor is also applied to the memory element. Bit line 214 is directly electrically connectable to memory element 232 by transistor 242. The invention also operates to prevent stray voltages from being placed on other conductors and electrical elements that can indirectly cause voltages to be placed on a memory element. For example, voltages placed on word line 210 can turn on transistor 242 to permit voltages on bit line 214 to reach memory element 232, and/or such voltages can leak through transistor 242 to node 260 that is directly connected to memory element 232 Thus, on the lowest level, the invention also operates to keep stray voltages from being placed on such other conductors and electrical elements during unstable power periods.

At an intermediate level, the invention operates on the control signals of the memory. For example, for a memory to be written to, the write enable control signal must be low. If the control signals are themselves controlled so that the control signals cannot be applied to the memory during periods of unstable power, then the likelihood of inappropriate signals being applied to a memory cell is greatly reduced. At another intermediate level, the invention operates on the logic circuits that apply signals to the memory array, such as array 45. If these logic signals are controlled so that they cannot be applied to the memory during periods of unstable power, the likelihood of inappropriate signals being applied to a memory cell is greatly reduced.

At a high level, the invention controls the application of power to the memory: for example, the invention operates to apply power to the memory logic first, and then, after the memory logic is operating as it was designed to do, only then is power applied to the memory array. If power is not applied to the memory array before the memory logic is operating properly, then the electrical components within the array cannot operate to produce and/or pass electrical voltages produced by the logic when it is not operating properly, and the likelihood of inappropriate signals being applied to a memory cell is greatly reduced.

To prevent the rewrite function from not being properly completed, the invention operates principally at the intermediate levels. That is, during the period of unstable power, the control signals and/or the other logic signals that are applied to the memory array are controlled so that any rewrite or write process that has been initiated will be completed without interruption. For example, if the control signals are disabled, or if the generation of new control or logic signals is prevented, and/or the logic producing these signals is stopped, i.e., paused or frozen, during the periods of unstable power, then the rewrite process will take place within the array without interruption.

2. Detailed Description

A preferred embodiment of a memory 36 according to the invention is shown in FIG. 1. For simplicity, the embodiment shown is for a 16 K×1 FeRAM; however, the material may be utilized in a wide variety of sizes and types of memories. In the 16 K embodiment shown, there are seven address input lines 38 which connect to a row address register 39 and a column address register 40. The row address register 39 is connected to row decoder 41 via seven lines 42, and the column address register 40 is connected to a column decoder/data input/output multiplexer 43 via seven lines 44. As known in the art, cell array 45 contains rows and columns of memory cells; the particular cell array illustrated contains 128 rows and 128 columns. As known in the art, there are many different possible ferroelectric memory cell array structures, and the invention can be utilized in combination with any of them. The row decoder 41 is connected to 128×128 memory cell array 45 via 128 lines 46 which carry what is conventionally known in the art as the word line signals, and the column decoder/data input/output multiplexer 43 is connected to the sense amplifiers 79 and memory cell array 45 via 128 lines 47, which carry what is conventionally known in the art as the bit line signals, and, in the embodiments discussed in FIG. 2, for example, also carry the plate line signals. A signal generator 80 is connected to array 45 via lines 84. These lines provide the timing signals other than the word, bit line, and plate line signals, for example, the $\Phi_1$ signal in FIG. 2. In some embodiments, timing generator 80 may also provide the plate line signals. The number of lines depends on which embodiment of the invention is utilized, the particular cell array structure, as well as the size of the array. A RAS* signal line 48 is connected to row address register 39, row decoder 41, column decoder/data input/output multiplexer 43, and signal generator 80, while a CAS* signal line 49 is connected to column address register 40, column decoder/data input/output multiplexer 43, and signal generator 80. In the discussion herein, a star, i.e. (*), indicates the inverse of a signal. An input/output data line 35 is connected to column decoder/data input/output multiplexer 43. Memory cell array 45 contains 128×128=16,384 memory cells, which is conventionally designated as 16 K memory. In the embodiments discussed below, the cells are ferroelectric switching capacitor-based cells, although any other type of ferroelectric cell, such as a cell based on a ferroelectric FET, may also be used.

In the embodiment of memory 36 according to the invention shown in FIG. 1, clamping circuit 22 is located between row decoder 41 and cell array 45, clamping circuit 24 is located between sense amps 79 and cell array 45, and clamping circuit 26 is located between timing signal generator 80 and cell array 45. Clamping circuit 22 holds word lines 46 to a known voltage, preferably ground, while the memory is being powered up and powered down, or is in a brownout condition. Clamping circuit 24 holds bit and plate lines 47 to a known voltage, preferably ground, while the memory is being powered up and powered down, or is in a brownout condition. Clamping circuit 26 holds timing signal lines 84 to a known voltage, preferably ground, while the memory is being powered up and powered down, or is in a brownout condition. In the brownout and power-down conditions, the clamping circuit operates only after the rewrite function has been completed.

The operation of the memory in FIG. 1 is as follows. Row address signals $A_0$ through $A_6$ and column address signals $A_7$ through $A_{13}$ placed on lines 38 are multiplexed by address registers 39, 40 utilizing the RAS* and CAS* signals, and passed to row decoder 41 and column decoder/data input/output multiplexer 43, respectively. Row decoder 41 places a word line signal on one of the word lines 46; generally a signal is placed on the word line of the cell that it is addressed. Column decoder/data input/output multiplexer 43 either places the data signal which is input on line 35 on the one of the input lines 47 corresponding to the column address, or outputs on the data line 35 the signal on the one of the output lines 47 corresponding to the column address, depending on whether the function is a write or read function. As is known in the art, the read function is triggered when the RAS* signal precedes the CAS* signal, and the write function is triggered when the CAS* signal comes before the RAS* signal. Sense amplifiers 79 are located along lines 47 to amplify the signals on the lines. The timing signals are produced by signal generator 80 based on the CAS* and RAS* signals and an internal chip clock. In some memories, signal generator 80 and row decoder 41 may be combined into a single signal generation unit. The circuitry of row decoder 41, column decoder 43, and signal generator 80 is known in the art of integrated circuit memory design, and will not be further discussed herein. Other logic required or useful to carry out the functions outlined above as well as other known memory functions is also included in memory 36 but is not shown or discussed as it is not directly applicable to the invention.

Figure 2:
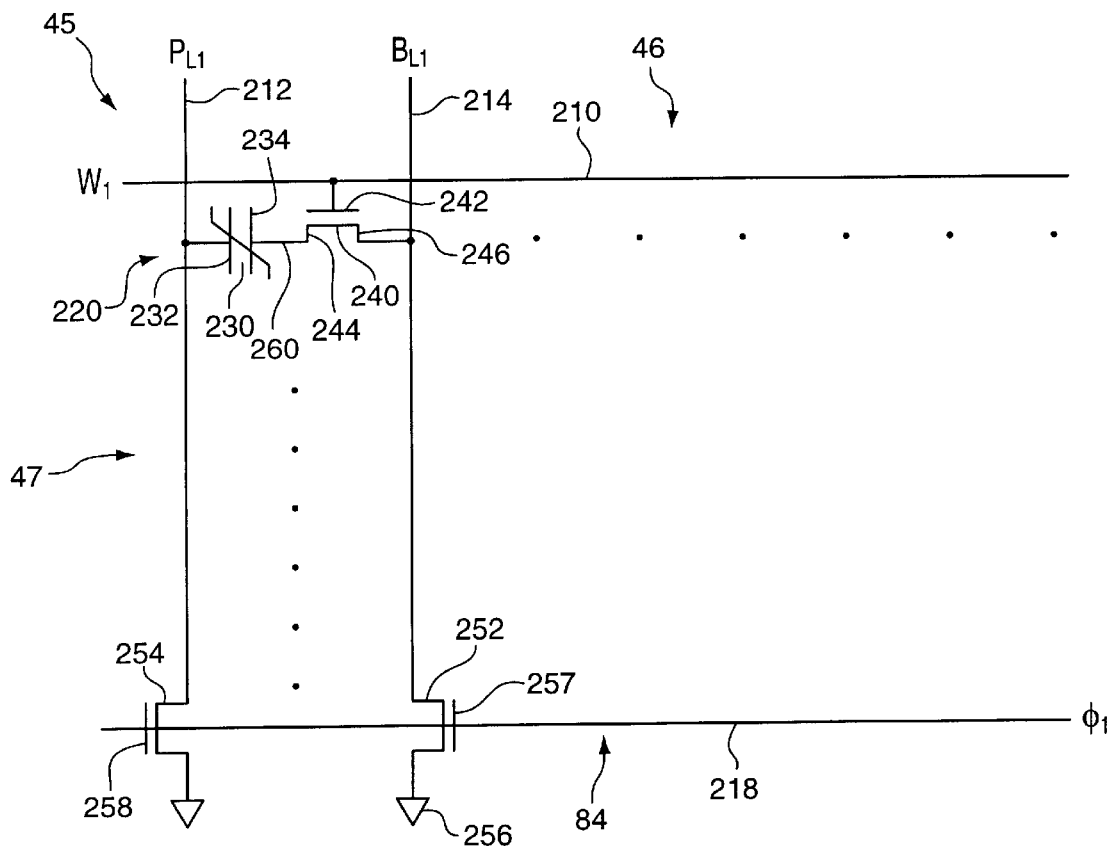
FIG. 2 is a schematic diagram of one embodiment of the memory array of FIG. 1.

A simplified example of a cell array 45 is shown in FIG. 2. Cell array 45 includes a set 46 of 128 word lines, one of which, 210, is explicitly shown by way of example. Cell array 45 also includes a set 47 of 128 plate lines and 128 bit lines; one plate line 212 and one bit line 214 are explicitly shown by way of example. Cell array 45 also includes a set 84 of timing signal lines, one of which, 218, is explicitly shown by way of example. Cell array 45 also includes 16,384 identical memory cells, one of which, 220, is shown by way of example. Memory cell 220 includes a ferroelectric capacitor 230 and a transistor 240. One electrode of ferroelectric capacitor 230 is connected to plate line 212, and the other electrode is connected to one source/drain 244 of transistor 240. The other source drain 246 of transistor 240 is connected to bit line 214. Gate 242 of transistor 240 is connected to word line 210. Precharge transistors 252 and 254 are connected between the bit and plate lines, respectively, and ground, which is shown as an inverted triangle, such as 256. Gates 257 and 258 of transistors 252 and 254, respectively, are connected to timing signal line 218. As known in the art, ferroelectric memory array, such as 45, typically will include other electronic elements and several additional timing lines, but these are not shown so as to simplify the drawing and more clearly explain the invention.

Figure 3:
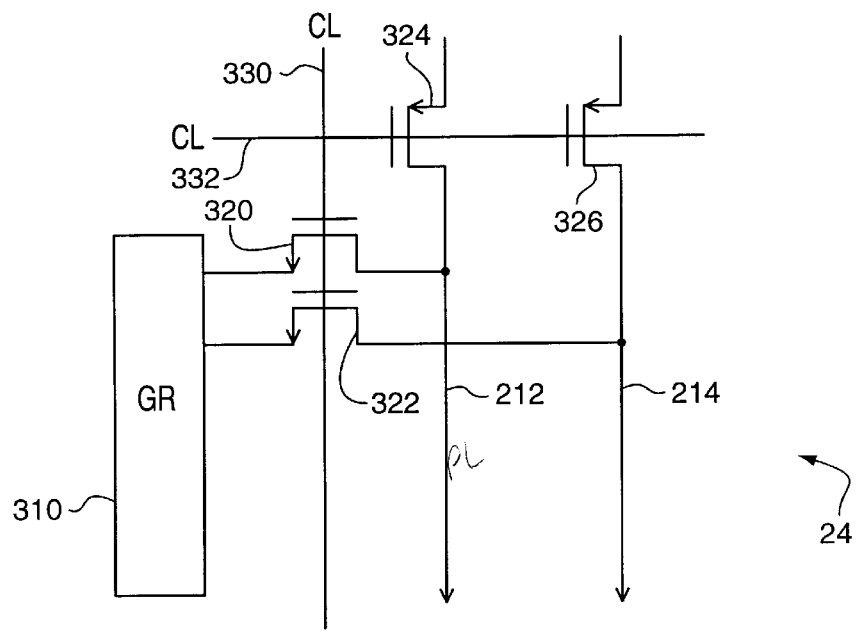
FIG. 3 is an electrical circuit diagram of the preferred embodiment of disturb prevention clamping circuit of FIG. 1.

A preferred embodiment of a clamping circuit 24 is shown in FIG. 3. Clamping circuit 24 includes positive threshold n-channel transistors 320 and 322, and negative threshold p-channel transistors 324 and 326. The thresholds of the transistors should be selected so that the p-channel transistors are on when the n-channel resistors are on. The drain of transistor 320 is connected to plate line 212 and its source is connected to ground plane 310; the drain of transistor 322 is connected to bit line 214 and its source is connected to ground plane 310. The drain of transistor 324 is connected to plate line 212 and its source is connected to the one of lines 47 (FIG. 1) that connects to plate line 212; the drain of transistor 326 is connected to bit line 214 and its source to the one of lines 47 that connect to bit line 214. The gates of each of transistors 320 and 322 are connected to line 330, and the gates of each of transistors 324 and 326 are connected to line 332. Similarly, each of the other plate and bit lines 47 will have a pair of transistors corresponding to transistors 320 and 324, though one pair of transistors can also serve a plurality of plate and bit lines.

Clamping circuit 24 operates as follows. A signal CL is applied to lines 330 and 332 as soon as power is applied to memory 36. The threshold of transistors 320,322, 324 and 326 is lower than that of any other transistors in memory 36, and they are of relatively small area. Thus, transistors 320 and 322 come on before any other electronic device in the memory comes on, and, therefore, ground plate line 212 and 214 before any charge can build up on them. Likewise, as soon as power is applied to memory 36, transistors 324 and 326 turn off, and ensure that no voltage can be applied to plate line 212 and bit line 214 by inadvertent voltages on lines 47. Once the memory power supply Vdd is high enough so that the logic is operating properly, CL goes low and the memory operates as it would if transistors 320, 322, 324 and 326 did not exist. The signal CL is triggered whenever Vdd drops below a predetermined threshold voltage. Thus, when the circuit is powered down, once the rewrite cycle is completed, transistors 320 and 322 come on, and transistors 324 and 326 are turned off, preventing stray voltages that may occur after the logic is no longer functioning properly from disturbing cells connected to plate line 212 and bit line 214. Clamping circuits 22 and 26 are designed to operate similarly to clamping circuit 24, except that they are connected to corresponding lines 46 and 210 and 84 and 218, respectively.

Figure 4:
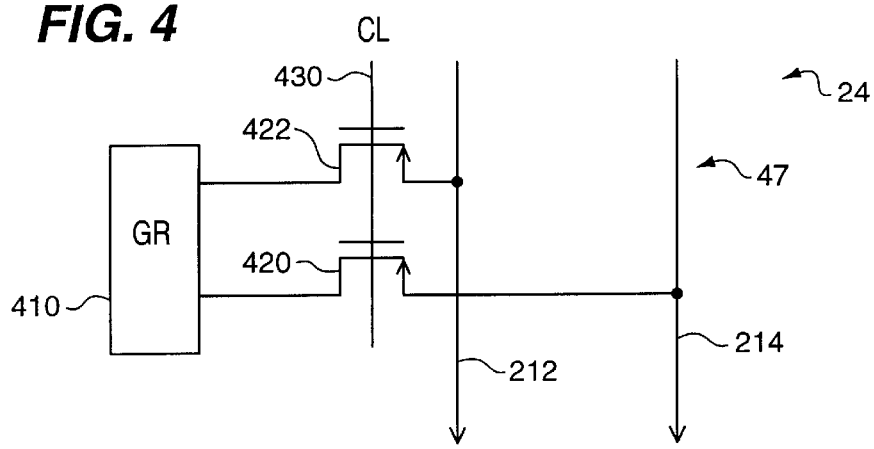
FIG. 4 is an electrical circuit diagram of an alternative preferred embodiment of the disturb prevention clamping circuit of FIG. 1.

FIG. 4 shows another preferred embodiment of clamping circuit 24 according to the invention. This embodiment includes p-channel transistors 420 and 422. The source of transistor 420 is connected to bit line 214 and the drain is connected to ground 410. The source of transistor 422 is connected to plate line 212 and the drain is connected to ground 410. The gates of transistors 420 and 422 are connected to conducting line 430. Similarly, each of the other plate and bit lines in lines 47 are connected to ground through a p-channel transistor. The transistors 420 and 422 are designed so that if any charge develops across the transistor when CL is floating or low, the transistor will turn on and the charge will be dissipated. Native $V_T$ threshold transistors should be used to keep the clamp operating down to near zero voltage. Further, CL is driven low immediately upon power up of memory 36. Thus, any charge developing on the plate or bit lines will immediately flow to ground. After the power comes up, CL is driven high, which turns off transistors 420 and 422, thus the plate and bit lines are isolated from ground and the circuit operates as though transistors 420 and 422 did not exist. The threshold voltage of transistors 420 and 422 is set so that if the power drops below a value where the memory will not function properly, thus dropping CL, they turn on, and thus prevent any charge that can cause a disturb from building on plate line 212 and bit line 214. Similarly, the other lines 47 are connected to ground by clamping circuit 24. This embodiment can also be applied to clamping circuits 22 and 26.

Figure 5:
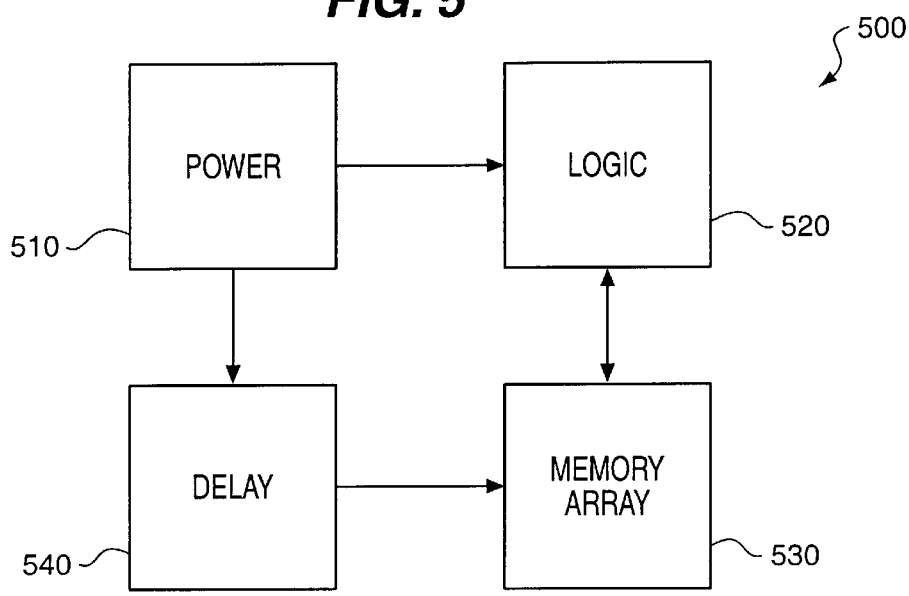
FIG. 5 is a block diagram of another embodiment of a memory according to the invention.

Another embodiment of a memory 500 according to the invention is shown in FIG. 5. Memory 500 includes a power source 510, memory logic 520, memory array 530, and delay circuit 540. Other than the inclusion of delay circuit 540, memory 500 is conventional. When power is turned on, power source 510 immediately applies power to memory logic 520 and delay circuit 540. Circuit 540 delays the application of power to memory array 530 until logic 520 is active, and then applies power to memory 530. The delay is preferably between 20 nanoseconds and a microsecond. Since power is not applied to array 530 until logic 520 is functional, inadvertent disturb voltages cannot be applied to the memory cells in memory array 530. Circuits that delay the application of a voltage, such as a string of inverters, are well-known in the art, and thus the delay circuit is not described in detail.

Figure 6:
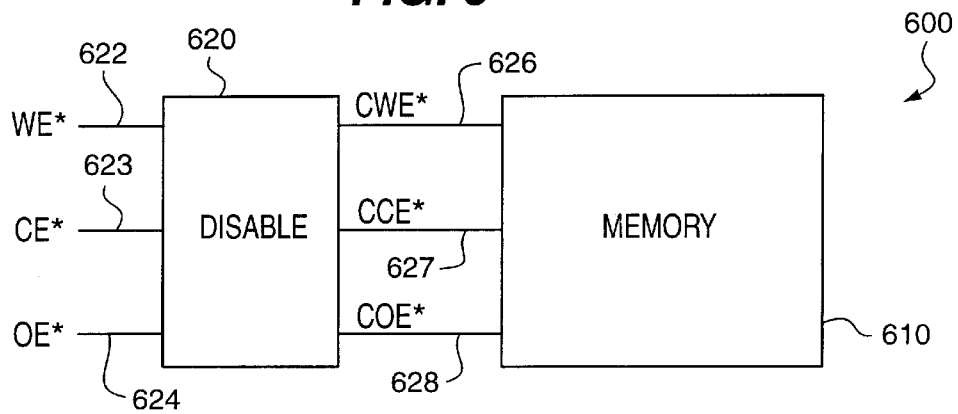
FIG. 6 is a block diagram of another preferred embodiment of a memory according to the invention.

FIG. 6 shows a further embodiment of a memory 600 according to the invention. This embodiment uses the fact that every conventional memory utilizes one or more input control signals that are enabling of the circuit, such as the write enable signal, the chip enable signal, and the output enable signal. These signals are typically active low signals, which means that they have to go high and then low before they enable anything. Being active low signals, they are usually designated by a bar over the name of the signal. Because of the difficulty writing the bar, we shall substitute a star (*) for the bar herein. Thus, the write enable signal shall be designated WE*, the chip enable signal shall be designated CE*, and the output enable signal shall be designated OE*. In the circuit of FIG. 6, these signals are disabled until Vdd has risen high enough that the logic within the memory is functioning.

The memory of FIG. 6 includes a conventional ferroelectric memory 610 and a disable circuit 620. The WE*, CE*, and OE* signals are input into disable circuit 620 on lines 622, 623, and 624, respectively. Disable circuitry 620 outputs signals CWE*, CCE*, and COE*, respectively, on lines 626, 627, and 628, respectively, which signals are applied to memory 610 on the conventional WE*, CE*, and OE* inputs. The CWE*, CCE*, and COE* signals essentially reproduce the WE*, CE*, and OE* signals except during power-up, power-down, brownouts and other unstable electronic conditions, during which time they are held "high" so that they cannot enable memory activities. The term "high" is in quotation marks here because the signal will not always be at the full Vdd voltage, since during these periods, the supply voltage is often rising or falling.

Figure 7:
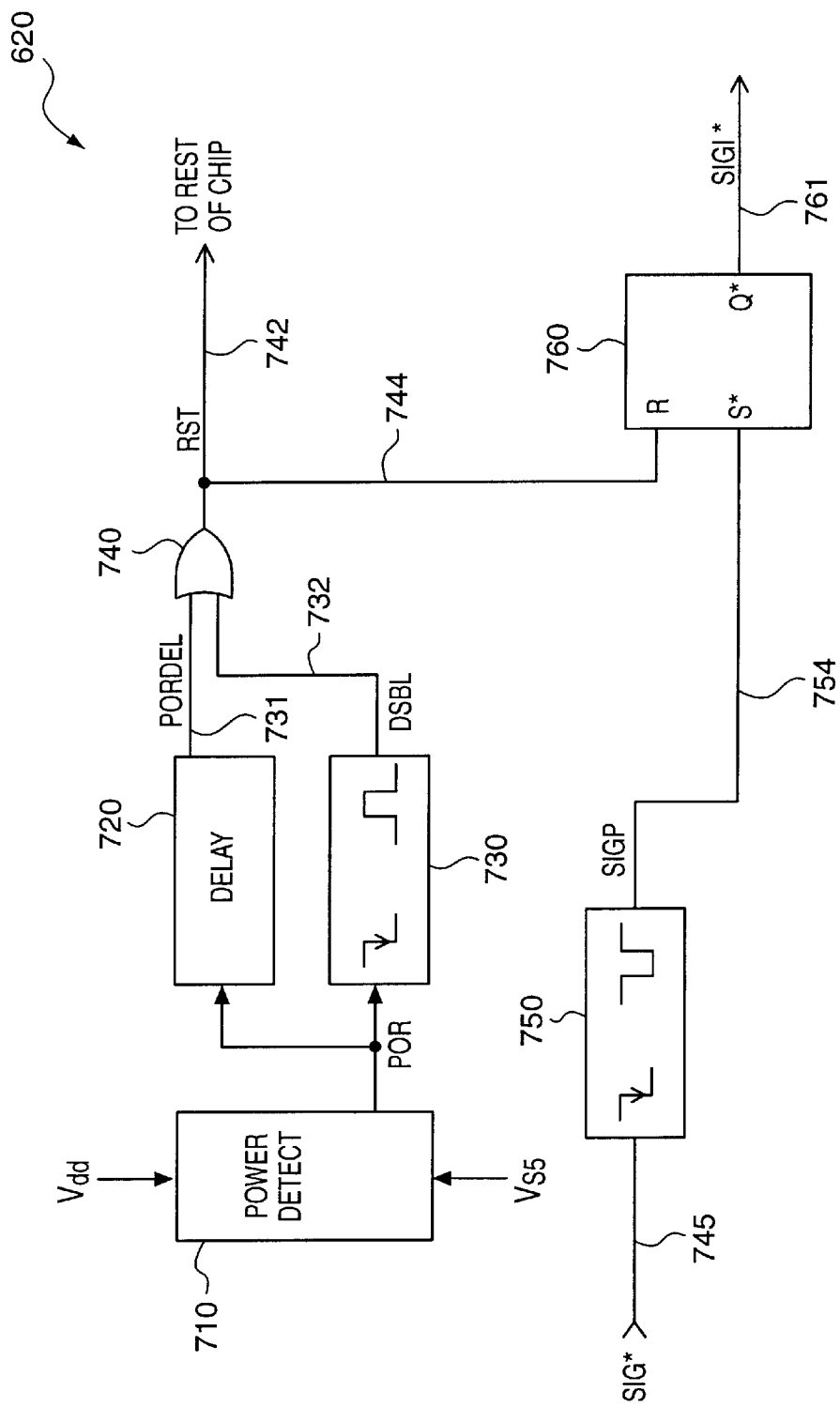
FIG. 7 is an electrical circuit diagram of the disturb prevention control signal disable circuit of FIG. 6.

An exemplary preferred embodiment of a disable circuit 620 is shown in FIG. 7. The embodiment shown is for a typical control signal, which is called SIG*, in this discussion. SIG* can be WE*, CE*, OE*, or any other active low control signal. Disable circuit 620 includes power detect circuit 710, one-shot 730, delay circuit 720, OR gate 740, one-shot 750, and latch 760. Power detect circuit 710 provides the POR signal to one-shot 730 and delay circuit 720. Delay circuit 720 provides a PORDEL signal on line 731 as one input to OR gate 740. One-shot 730 provides a DSBL signal on line 732 as the other input to OR gate 740. The output of OR gate 740 provides, on line 742, an RST signal that resets the rest of the memory via line 742, as well as latch 760 via line 744. The control signal SIG* is input to one-shot 750. The output of one-shot 750 provides a falling pulse signal, SIGP, on line 754, which signal provides the input to the S* input of latch 760. The Q* output latch 760 provides the SIGI* signal that is input to the corresponding control signal pin of memory 600. If SIG* is the signal WE*, CE*, or OE*, respectively, then SIGI* is the signal CWE*, CCE*, and COE*, respectively.

Power detect circuit 710 is a conventional power-on-reset circuit that provides a POR signal. Delay circuit 720 is also any one of many known circuits which delay a signal as known in the art. Typically, these circuits comprise a series of inverters or operational amplifiers, each of which provide a small delay in the signal. If inverters are used, an even number are used so that the PORDEL signal goes in the same direction as the POR signal. One-shots 730 and 750 are also conventional circuits that produce a single short pulse in response at the falling edge of the POR signal. A typical circuit that performs the function of one-shot 730 would be an AND gate, one input of which is the POR signal, and the other input of which is the POR signal delayed by an odd number of inverters. Similarly, one-shot 750 can be implemented with a NAND gate, one input of which is the SIG* signal, and the other input of which is the SIG* signal delayed by an odd number of inverters. In latch 760, the Q* output follows the S* input, provided the reset input is low. If the reset input is high, the Q* output is always high.

Figure 8:
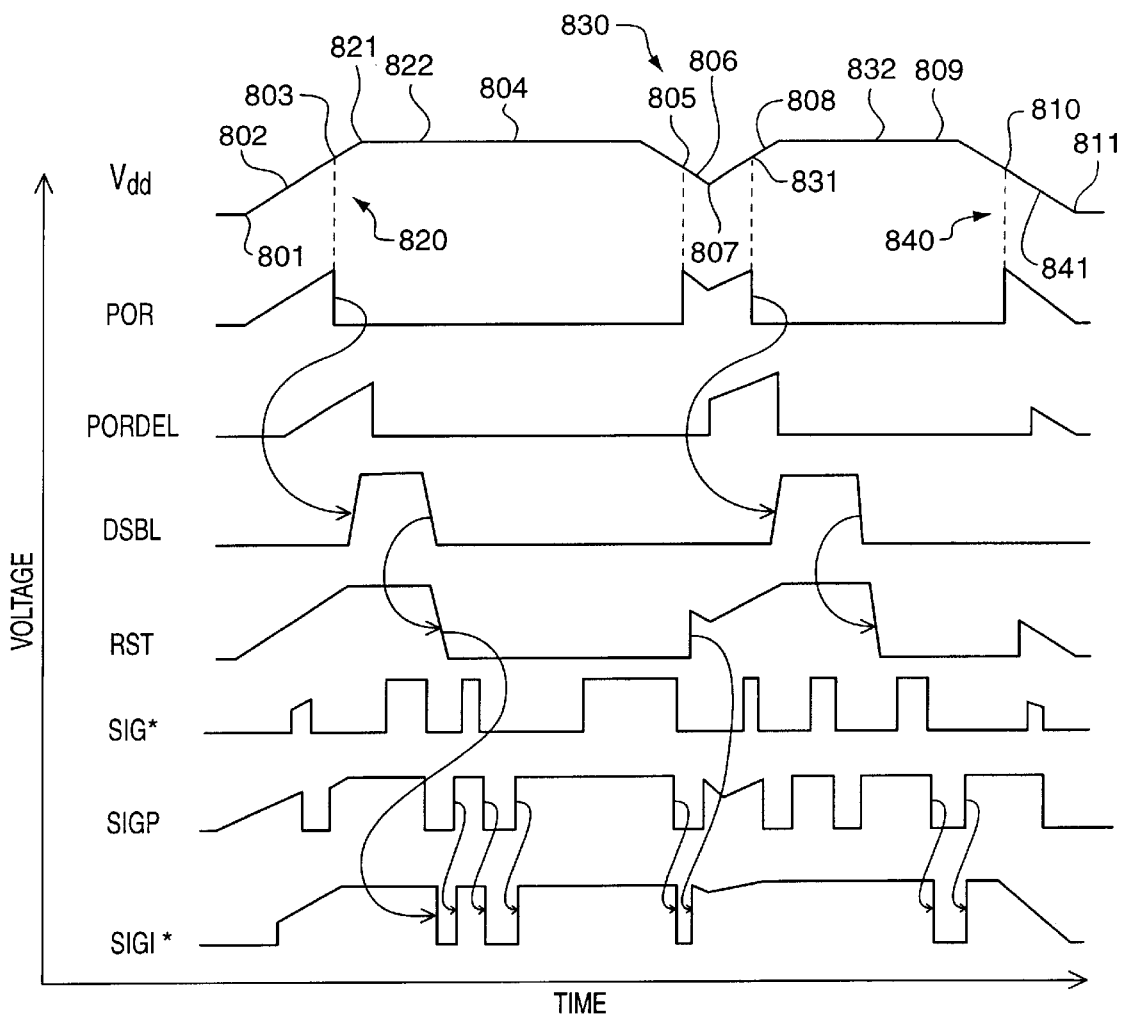
FIG. 8 is a timing diagram of the principal voltage signals relating to the embodiments of FIGS. 6 and 7.

The operation of disable circuit 620 can be seen using the timing diagram for the circuit, which is shown in FIG. 8. As conventional in the art, the timing diagram is a series of curves showing the various signals of circuit 620 in volts as a function of time. Also as conventional in timing diagrams, the time and voltage scales are not given, since the timing diagram is intended to be only a qualitative description of the timing to assist in understanding the operation of the circuit. To illustrate the operation in the power-on, brownout, and power-down conditions, the supply voltage, Vdd, is shown at 802 rising from zero volts as it does in a normal turn-on mode, then stays on at full supply voltage for a time 804, then drops for a period 806 to the minimum 807, rises during the period 808, then stays at the full supply voltage again for a time at 809, then falls to zero in a normal turn off mode at 810. This permits the responses of the various signals to be shown for all three of these conditions. As Vdd rises from zero, the POR signal follows it until the ON threshold voltage 803 is reached. It then relatively sharply drops to zero and stays low until Vdd again falls to the point where the OFF threshold voltage 805 is reached, at which point it rises and follows Vdd again. Preferably, the threshold voltages 803 and 805 are approximately 4 volts. The ON threshold voltage and the OFF threshold voltage may be the same; however, preferably, as known in the art, the OFF threshold voltage 805 is slightly lower, by say about 200 millivolts, than the ON threshold voltage 803. The differences in the two voltages prevents the system from oscillating on and off. As mentioned previously, "high" in quotation marks means the voltage which Vdd is at. When the system is turning on or off, this may be lower than the nominal high voltage of the system, and thus the quotation marks. PORDEL also follows Vdd up, though with a small delay, preferably of about 10 microseconds. It drops following the drop of POR, with the same delay, then rises with the same delay when the OFF threshold is reached. In the example shown, the period over which the voltage drops is shorter than the delay between POR and PORDEL, so when PORDEL comes back up, it at first does not rise as high as POR did when it rose, because Vdd has fallen, and then follows the rising Vdd, then drops to zero at a time period equal to the delay after the ON threshold is reached. At shut-down, it again rises a delay period after the OFF threshold is reached, though not as high as POR did, and then falls to zero with Vdd. DSBL starts low. The drop in POR at the ON threshold triggers a one-shot rising pulse that lasts as long as the delay built into the one-shot, preferably about 30 microseconds. This behavior is repeated again when POR drops after the brownout, and similarly anytime POR drops. Since RST is the output of OR gate 740, it is high when either PORDEL or DSBL are high, and is low only when both PORDEL and DSBL are low. If, during the period when RST is high, Vdd is not at the full supply voltage, then RST follows Vdd. The SIG* signal, like Vdd, is devised to illustrate the various possibilities to which circuit 620 may respond. It is shown pulsing up and falling during the power-up period, and several times after the system is powered up, pulsing up and falling down several times in each portion of the Vdd cycle with different pulse widths. SIGP simply produces a falling pulse at each falling edge of SIG*. The pulse should be shorter than the permitted period between control signals but long enough to trigger latch 760. SIGI*, being the Q* output of latch 760, rises at power-up as soon as the RST signal reaches the latch threshold voltage, and does not respond to any rising or falling pulses as long as RST is high. Thus, the control signal SIG* is disabled during this period. However, once RST goes low, it follows SIGP. Again, when RST goes high in the brownout period, SIGI* stays high and SIG* is disabled. At shut-down, SIGI* drops gradually with the drop of Vdd, and RST going high at the "OFF" threshold keeps SIGI* from dropping fast enough to trigger a memory function before the power is off.

Since the control signal is held high until all logic in the system can come up to full operational status, and goes high again before the power drops to a point where erroneous and unintended disturb signals can develop either in a brownout or power-down situation, the memory is prevented from carrying out a control command in situations where an erroneous or sporadic disturb voltage can develop. If more than one control signal is to be disabled, then the portion of circuit 620 including one-shot 750 and latch 760 is replicated for each of the control signals. Preferably, there are three of these circuit portions, one for each of the WE*, CE*, and OE* signals.

Figure 10:
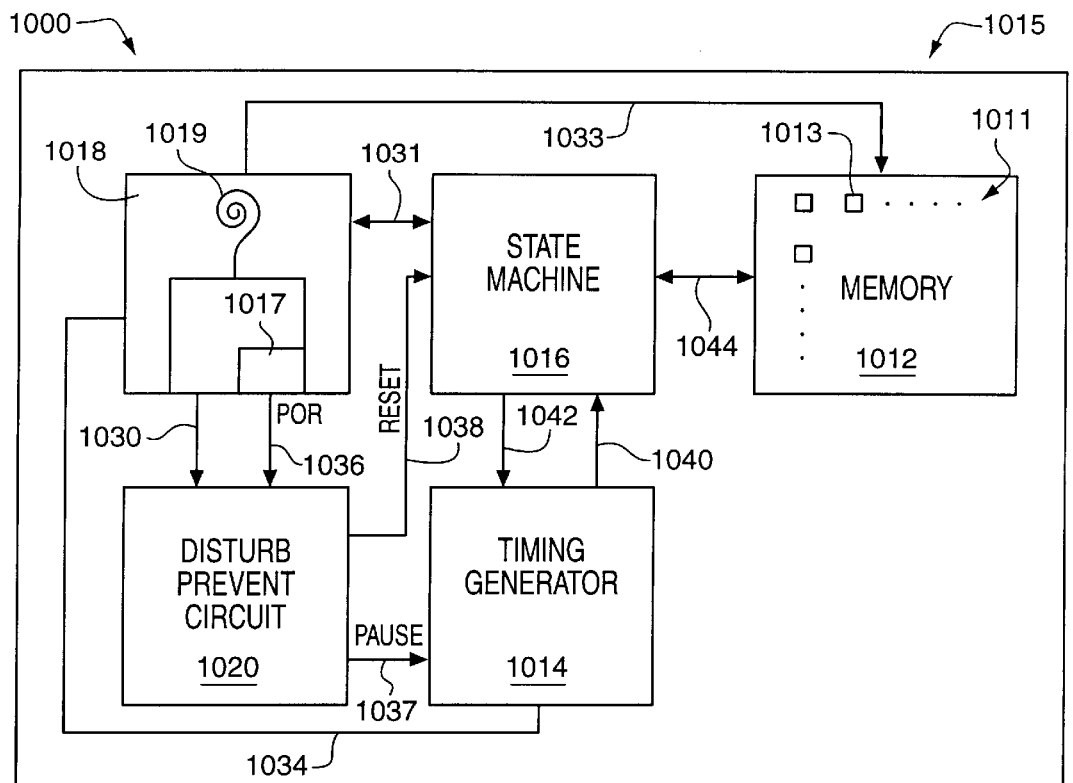
FIG. 10 is a block circuit diagram of another preferred embodiment of a memory according to the invention.

Turning to FIG. 10, a block schematic diagram of a preferred embodiment of the invention as applied to a destructive readout radio frequency identification (RFID) card memory system 1000 is shown. RFID card memory system 1000 is preferably a contactless RFID card that receives power and communicates with an external device via radio frequency (RF) radiation. RFID card 1000 includes an array 1011 of memory cells 1013 within memory 1012, analog and digital logic 1015 for writing, reading, and rewriting data to and from memory cells 1013 in array 1011, a power source 1018, and a disturb prevention circuit 1020, which in this embodiment is a disturb prevention (DP) circuit 1020. Logic 1015 includes a timing signal generator 1014, a state machine 1016, as well as logic within memory 1012. Power source 1018 provides power to DP circuit 1020, state machine 1016, memory array 1012, and timing signal generator 1014 via multiconductor electrical lines 1030, 1031, 1033, and 1034, respectively. State machine 1016 provides signals to power source 1018 via line 1031 also. As discussed above, memory array 1012 includes a plurality of memory cells 1013 as well as circuitry for addressing and writing, reading and rewriting data to and from the cells. Power source 1018 includes a circuit 1019 for deriving power from a radio frequency signal, and a power-on-reset circuit 1017 that provides a power-on-reset signal, POR, to disturb prevention (DP) circuit 1020 via line 1036, and DP circuit 1020 provides a PAUSE* signal to timing signal generator 1014 via line 10 and a RESET signal to state machine 1016 via line 1038. Timing signal generator 1014 provides timing signals to state machine 1016 via multiconductor electrical line 1040, and state machine 1016 provides signals to timing signal generator 1014 via multiconductor electrical line 1042. State machine 1016 and memory array 1012 exchange signals, including address and data signals, via multiconductor electrical line 1044. As known in the art, state machine 1016 comprises a circuit for reading the data in memory cell 1113, and rewriting the data to the memory cell after it has been read. In FIG. 10, we have only shown the portions of RFID card memory system 1010 and the electrical connections of these portions that are important to understanding the invention. The RFID card memory system 1010 also includes other conventional electrical circuits and electrical connections, such as a clock and electrical lines associated with it, but these shall not be discussed since they are known in the art. For ease of understanding by those who may not be familiar with conventional RFID card functions, the RFID card memory system 1010 is essentially a computer, with power source 1018 in many respects analogous to a computer power source, logic 1015 in many respects analogous to the CPU and mother board of the computer, and similarly memory 1012 is analogous to the memory in a computer. The invention primarily involves disturb prevention circuit 1020 which provides a signal that freezes timing signal generator 1014 until the rewrite cycle of memory array 1012 is completed.

DP circuit 1020 responds to a power-on-reset input signal, POR, to produce two output signals, a global reset signal, RESET, and a pause signal, PAUSE*. The POR signal is an active high signal that tracks the system voltage, Vdd, produced by power source 1018 when Vdd is below a threshold voltage, and goes low when Vdd is higher than the threshold voltage. Preferably, the threshold voltage is 4 volts, though it can be set to any appropriate voltage that is high enough that the memory logic will operate reliably at the voltage. The RESET signal is an active high signal that resets all latches in state machine 1016 to a known start state. The PAUSE* signal is an active low signal that causes the timing generator 1014 to pause, which in turn causes state machine 1016 to hold the data to be rewritten in memory 1012 until the rewrite cycle is completed.

Figure 9:
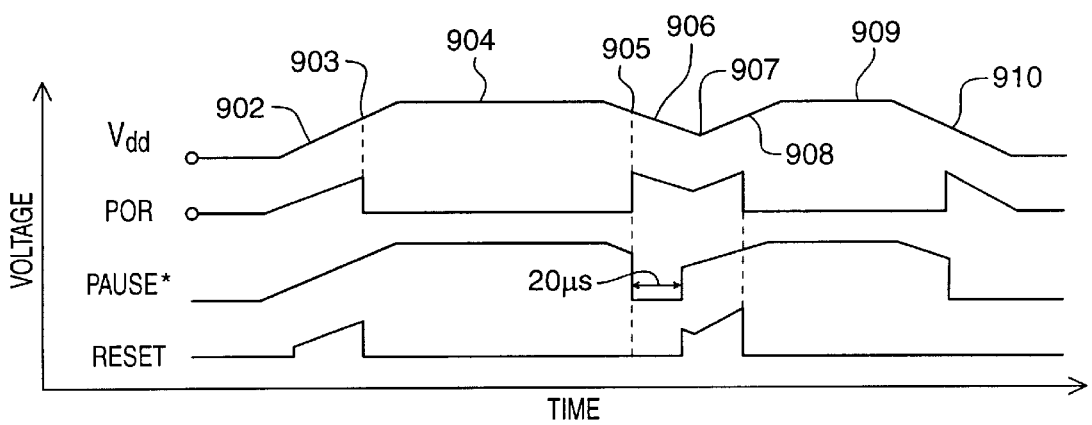
FIG. 9 is a timing diagram illustrating the operation of the circuit of FIG. 10.

FIG. 9 is a timing diagram illustrating the operation of the embodiment of the invention shown in FIG. 10. In FIG. 9, the preferred temporal length of certain pulses is shown to better illustrate how the invention prevents disturbance of the rewrite cycle. To illustrate the operation in the power-on, brownout, and power-down conditions, the supply voltage, Vdd, is shown at 902 rising from zero volts as it does in a normal turn-on mode, then stays on at full supply voltage for a time at 904, then drops for a period 906 to the minimum 907, rises during the period 908, then stays at the full supply voltage again for a time at 909, then falls to zero in a normal turn-off mode at 910. This permits the responses of the various signals to be shown for all three of these conditions. As Vdd rises from zero, the POR signal follows it until the ON threshold voltage 903 is reached. It then relatively sharply drops to zero and stays low until Vdd again falls to the point where the OFF threshold voltage 905 is reached, at which point it rises and follows Vdd again. Preferably, the threshold voltages 903 and 905 are approximately 4 volts. The ON threshold voltage and the OFF threshold voltage may be the same; however, preferably, as known in the art, the OFF threshold voltage 905 is slightly lower, by say about 200 millivolts, than the ON threshold voltage 903. The differences in the two voltages prevents the system from oscillating on and off. Again, "high" in quotation marks means the voltage which Vdd is at. The PAUSE* signal starts low at power-up, and then follows Vdd until POR pulses high at the OFF threshold 905. The rise of POR causes PAUSE* to go low. PAUSE* remains low, preferably for approximately 20 microseconds, then returns "high" and follows Vdd. RESET also starts low. As soon as the threshold of the simpler electronic elements, such as inverters, is reached, RESET goes "high" and also follows Vdd up. When POR goes low, the logic in disturb protect circuit 1020 forces RESET low shortly thereafter. When Vdd drops to the OFF threshold voltage 905, POR rises again. However, before the rising POR signal can cause RESET to return high, PAUSE* has gone low which causes RESET to stay low for an additional time, which additional time is shorter than the length of time PAUSE* stays low. Thus, RESET returns "high" just before PAUSE* goes "high". When POR again goes low, with PAUSE* staying "high", RESET goes low.

The same sequence occurs when POR again goes "high" in the turn-off mode 906, except that POR and PAUSE* follow Vdd down to zero after they go "high". Depending on how fast Vdd is falling to zero, PAUSE* and RESET may return "high", as they did in the brownout condition, and then fall to zero with Vdd, or PAUSE* and RESET may stay low. In FIG. 9, the latter condition is shown; that is, Vdd is falling fast enough that PAUSE* and RESET stay low. In either case, the rewrite operation is not disturbed because in either case PAUSE* stays low sufficiently long for the rewrite to be completed.

As indicated above, the PAUSE* signal is output to timing signal generator 1014 to hold it frozen when PAUSE* is low. Thus, whenever Vdd falls to the OFF threshold value, timing signal generator 1014 remains frozen, preferably for approximately 20 microseconds. This is more than enough time for any rewrite cycle in memory array 1012 to be completed. Note that RESET goes high slightly before PAUSE* goes high. Thus, timing signal generator 1014 is released only after the system is reset. This is critical because it prevents state machine 1016, or other system addressed by DP circuit 1020, from proceeding with its transactions before Vdd is high enough to perform the transactions reliably. Also note that the clamping and power delay functions described above, which are part of the invention, themselves are frozen during the period when a rewrite function is being performed, so that these functions also cannot operate to disturb the rewrite function. As a result of the above apparatus and methods, data cannot be lost by a brownout in memory system 1010 according to the invention.

Figure 11:
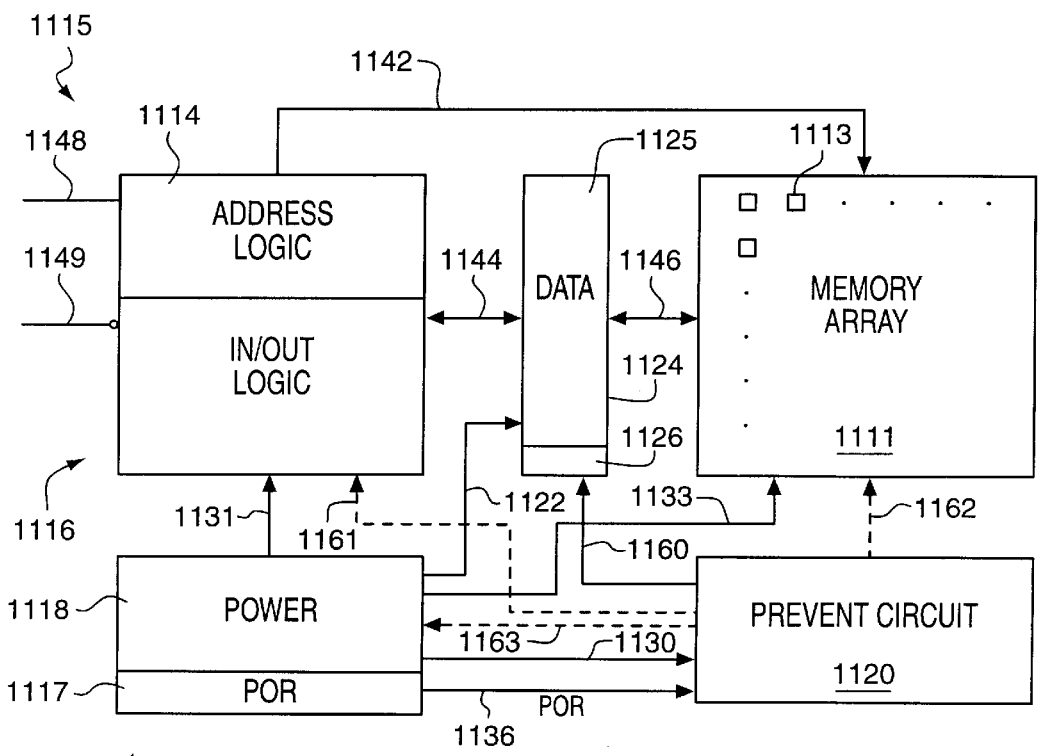
FIG. 11 is a block diagram of a further preferred embodiment of a memory according to the invention.

Turning to FIG. 11, a circuit diagram illustrating a generalized integrated circuit memory 1100 according to the invention is shown. As known in the art, electronic memories typically include an array 1111 of memory cells 1113 and logic circuitry 1115 for writing, reading, and rewriting data to and from the memory cells in array 1111. For ease of understanding, logic 1115 is divided into address logic circuitry 1114 for addressing the cells in array 1111 and input/output logic circuitry 1116 for inputting data into the memory array and outputting data from the memory. Address logic communicates with array 1111 via line 1142, and input/output logic 1116 communicates with array 1111 via lines 1144 and 1146. Data storage device 1124 is generally considered to be part of input/output logic 1116, but is separated out for purposes of this disclosure to more fully explain the invention. As known in the art, lines 1142, 1144, and 1146 are preferably multiconductor electrical cables that carry parallel address, data, clock and other signals, though they may also be a one or more serial electrical lines. A power source 118 provides power including a supply voltage Vdd. Power source 1118 may be a circuit for receiving power from an external power line (not shown) or from an internal source, such as a battery (not shown). Power source 1118 also preferably includes a power-on-reset circuit 1117 that provides a power-on-reset signal (POR) to reset memory logic 1115 to known start-up values whenever the circuit comes on. As indicated above, such power-on-reset circuits are known in the art and will not be discussed in detail herein. The POR signal also is applied to disturb prevention circuit 1120 via line 1136. The POR line is shown separately with respect to its connection to circuit 1120 since this is the only application of the signal that we need be concerned with in detail in this embodiment. The power lines, such as lines 1131, 1122, and 1133 connecting the power source 1118 with the other portions of the memory are generally multiconductor electrical cables, one or more conductors of which supply the system voltage and ground, and others of which carry signals such as the POR signal. Power line 1130 to the DP circuit is also a multiconductor electrical cable which includes both the supply voltage line and the ground line, and can include lines carrying other signals as well.

As known in the art, address logic 1114 and input/output logic 1116 operate cooperatively to write data input on input/output line 1149 to addresses in memory array 1111 determined by signals on address line 1148, and to read data at addresses in memory array 1111 determined by signals on address line 1148 and output the data on input/output line 1149. Except for data storage device 1124, memory array 1111, address logic 1114, and input/output logic 1116 will not be described in detail herein since these are all well-known circuits. For a more detailed description of these portions of the circuit for a typical ferroelectric destructive readout memory, see U.S. Pat. No. 5,406,510 issued to Mihara et al. on Apr. 11, 1995, which is hereby incorporated by reference as though fully disclosed herein.

The generalized memory 1110 according to the invention also includes a disturb prevention (DP) circuit 1120. Circuit 1120 is central to the invention and several specific embodiments, i.e., DP circuit 620 of FIGS. 6 and 7 and DP circuit 1020 of RFID card memory system 1000 have been described in detail herein. That is, from the discussions below and the discussions with respect to the generation of other signals generated by the POR signal, such as the DSBL, RST, and PAUSE* signals, those skilled in the art will be able to generate an FRZT signal from the POR signal. Data storage device 1124 represents a storage area where the data to be rewritten to memory array is physically stored in the form of an electronic state or signal immediately after one or more memory cells of array 1111 are read and before the cell or cells have been rewritten. In an alternative preferred embodiment of the invention, data storage device 1124 comprises a set of multiple state data storage elements 1125 that hold the data to be rewritten to memory array 112. In this embodiment, preferably, the data storage device 1124 also includes a freeze circuit 1126 that prevents the state of elements 1125 from changing so long as a predetermined signal, e.g., FRZT, is applied to circuit 126. In the memory described in U.S. Pat. No. 5,406,510, device 1124 is formed by a bit line, or a pair of complementary bit lines, and a sense amplifier. That is, during the rewrite cycle, the bit line, or the pair of complementary bit lines, is latched by a sense amplifier in a high or low voltage state representative of the data that has just been read. Device 1124 can also be any electronic device or devices capable of storing a data signal and being controlled to prevent the change of the signal during the rewrite cycle. Multiple state storage element 1125 may be a set of flip-flops, though it may also be a set of latches, a counter, a register or any other electronic device capable of assuming at least two states. In FIG. 11, data storage device 1124 is shown separate from input/output logic 1116 and memory array 1112 to more clearly illustrate the invention. It can be considered to be part of input/output logic 1116. It could also be considered to be a part of memory array 1111 depending on the viewpoint from which the circuit is analyzed and/or the particular implementation of data storage device 1124.

In an alternative preferred embodiment of FIG. 11, disturb prevention circuit (DP) circuit 1120 may be considered to be a sub-circuit of logic circuit 1115 that responds to a signal, POR (FIG. 3), from power source 1118 to apply a signal, FRZT, to data storage device 1124 via line 1160, which signal freezes the multiple state storage elements 1125 to prevent the rewrite data from changing until a time at which it is certain that the rewrite cycle is completed. In another alternative preferred embodiment of the invention, it may be considered to be a part of input/output logic 1116 or at least be a circuit which addresses input/output logic 1116, which is suggested by dotted line 1161 connecting DP circuit 1120 and input/output logic 1116. In other embodiments, DP circuit 1120 can be implemented as part of memory array 1111, as indicated by dotted communication line 1162, or power source 1118, as indicated by dotted communication line 1163.

A feature of the invention is that it prevents data from being lost in power-up, brownouts, power-down, and other similar non-optimum operating conditions without slowing the memory function or making the memory less dense. Since the function operates only on power-up, power-down and when the brownout or other condition occurs, it operates relatively infrequently, and, therefore, does not slow the overall function of the memory. Since the DP circuit does not change array 45,1011, 1111, or memory 610, but is a single circuit outside of the array or memory, it does not change the density of the array and does not significantly change the density of the memory system as a whole.

Another feature of circuit 620 and the invention is that the appropriate clamping, delay, pause, or freeze of the circuits described is produced by a relatively simple system of inverters, gates, and/or transistors, all of which operate reliably at voltages significantly less than the system voltage, and thus the DP circuit also operates reliably during brownout conditions.

It should be understood that the disturb prevention function can be implemented in many other ways than by circuits 24, 540, 620, 1014 and 1120 shown in the figures. For example, with respect to the memory of FIG. 11, it could be implemented as a counter or counters in logic circuit 1115, or other portion of memory 1000, that count a predetermined time that is longer than the time for the memory to come up to full power or the rewrite cycle, depending on the application. Or it could be a flip-flop, latch, or other logic element in logic circuit 1115, or other portion of memory 1100, that is reset or changed by a signal from memory array 1111 or address logic 1114 that indicates that the memory is operational or the rewrite function is finished. Or it could be a circuit in address logic 1114 that prevents a particular bit line, or other equivalent electronic element, that is involved in a particular read cycle from being addressed until the rewrite cycle is finished. Or data storage device 1124 could include a flip-flop, latch, or other circuit that holds it set for a predetermined period. Or power source 1118 could include a circuit that applies power to the various memory sub-circuits in a manner that prevents the disturb, such as by inhibiting turn on of input/output logic 1116 for a predetermined time or until the rewrite cycle is completed. Similarly, DP circuits 22, 24, and 26 of FIG. 1, and DP circuits 540, 620, and 1020 of FIGS. 5, 6, and 10 could be replaced with any of the above embodiments with corresponding changes in the rest of the circuit in each case as will be recognized by those skilled in the art.

It should also be understood that the particular embodiments described can be combined with each other in any reasonable manner. For example, the clamping embodiment of FIGS. 1–4 or the disable embodiment of FIG. 6 can be combined with the RFID memory of FIG. 10 or the memory of FIG. 11, the pause embodiment of FIG. 10 can be combined with the memories of FIGS. 1, 6, and 1 1, and so on. Further, two or more of the DP circuit embodiments may be combined together.

There has been described a novel destructive readout memory that does not lose data in power-up, power-down, brownout and other unstable conditions, and at the same time remains fast and dense. It should be understood that the particular embodiments shown in the drawings and described within this specification are for purposes of example and should not be construed to limit the invention which will be described in the claims below. Further, it is evident that those skilled in the art may now make numerous uses and modifications of the specific embodiments described, without departing from the inventive concepts. It is also evident that equivalent structures and processes may be substituted for the various structures and processes described. A variety of different implementations of the circuits may be used, or the signals discussed may in some instances occur in a different order. Consequently, the invention is to be construed as embracing each and every novel feature and novel combination of features present in and/or possessed by the destructive readout memory described.

We claim:

1. A destructive readout, nonvolatile memory system comprising:
   a power source for applying electrical power to said memory system;

a destructive readout, nonvolatile memory cell for holding data;

an electronic circuit selected from the group consisting of: a rewrite circuit for rewriting said data to said memory after it has been read; a data storage element for holding said data to be rewritten to said memory; and a power on reset circuit for resetting logic in said memory system when said voltage drops below an OFF threshold and then rises to an ON threshold; and a disturb prevention circuit for controlling at least one of said power source and said electronic circuits to prevent said data from being disturbed during a period when said electrical power is unstable.

2. A ferroelectric memory system comprising:

a power source for applying electrical power to said memory system;

a memory cell for holding data, said memory cell including a ferroelectric material;

a conductor selected from the group consisting of a bit line and a plate line: and a disturb prevention circuit for preventing signals that can disturb said data from being placed on said conductor during a period when said electrical power is unstable.

3. A memory system as in claim 2 wherein said period is selected from the group consisting of a power-up period, a power-down period, and a brownout period.

4. A memory system as in claim 2 wherein said disturb prevention circuit comprises a circuit for preventing disturb voltages from being applied to said memory cell during said period.

5. A memory system as in claim 2 wherein said memory includes: a rewrite circuit for rewriting said data to said memory cell after it has been read; and said disturb prevention circuit comprises a circuit for preventing one or more of the group consisting of: reset of said rewrite circuit before said data is rewritten; and overwriting of said data before said data is rewritten.

6. A memory system as in claim 2 wherein said disturb prevention circuit comprises a clamping circuit for clamping said conductor to a predetermined voltage.

7. A memory system as in claim 6 wherein said disturb prevention circuit comprises a circuit for clamping said plate line and said bit line to said predetermined voltage.

8. A memory system as in claim 7 wherein said voltage is the memory system ground.

9. A memory system as in claim 2 wherein said memory cell is part of an array of memory cells, said memory system further includes a logic circuit for applying signals to said array of memory cells and said power source applies power to said logic circuit and said memory array, and said disturb prevention circuit comprises a circuit for applying said power to said logic circuit prior to applying said power to said memory array.

10. A memory system as in claim 2 wherein said memory cell.

11. A memory system as in claim 2 wherein said memory system comprises an electrical line for applying a control signal within said memory system and said disturb prevention circuit comprises a disable circuit for disabling said control signal for a predetermined time.

12. A memory system as in claim 11 wherein said period is a power-up period and said predetermined time includes said power-up period.

13. A memory system as in claim 11 wherein said period is a power-down period and said predetermined time includes said power-down period.

14. A memory system as in claim 11 wherein said period is a brownout period and said predetermined time includes said brownout period.

15. A memory system as in claim 11 wherein said memory includes logic for applying a voltage signal to said memory cell, said period is a power-up period, and said predetermined time is a time sufficient to permit said logic to become operational.

16. A memory system as in claim 11 wherein said disable circuit includes a one-shot pulse generator circuit.

17. A memory system as in claim 11 wherein said disable circuit includes a latch.

18. A memory system as in claim 11 wherein said memory includes a logic circuit and said disable circuit includes a reset circuit for producing a reset signal for resetting said logic circuit.

19. A memory system as in claim 2 wherein said memory comprises a radio frequency identification card memory.

20. A memory system as in claim 2 wherein said memory includes a memory array and a logic circuit for applying a signal to said memory array, said cell is part of said memory array, and said disturb prevention circuit comprises a pause circuit for producing a pause signal for causing said logic circuit to pause during a predetermined time.

21. A memory system as in claim 20 wherein said logic circuit includes a timing generator responsive to said pause signal for pausing during said predetermined time.

22. A memory system as in claim 20 wherein said period is a brownout period and said predetermined time includes said brownout period.

23. A memory system as in claim 20 wherein said memory includes: a circuit for reading said data and rewriting said data to said memory cell after it has been read; and said predetermined time comprises a time sufficient to complete said rewriting of said data.

24. A memory system as in claim 20, wherein said disturb prevention circuit comprises a circuit for providing a freeze signal.

25. A memory system as in claim 24 wherein said memory includes a memory array and said memory cell is part of said memory array, said memory further includes a data storage element for holding data to be rewritten to said memory array, and a freeze circuit responsive to said freeze signal for preventing the state of said data storage element from changing.

26. A destructive readout memory system comprising:

a power source for applying electrical power to said memory system;

a destructive readout memory cell for holding data;

a logic circuit for writing, reading, and rewriting data into said memory cell; and a disturb prevention circuit for preventing said data from being disturbed due to a condition in which said electrical power is unstable; said disturb prevention circuit comprising a circuit communicating with said logic circuit for preventing said rewriting of said data from being disturbed due to said condition.

27. A memory system as in claim 26 wherein said condition is selected from the group consisting of a power-up condition, a power-down condition, a brownout condition.

28. A ferroelectric memory system comprising:

a power source for applying electrical power to said memory system;

a memory cell for holding data, said memory cell including a ferroelectric material;

a logic circuit for writing, reading, and rewriting data into said memory cell; and a disturb prevention circuit for preventing said data from being disturbed due to a condition in which said electrical power is unstable; said disturb prevention circuit comprising a circuit communicating with said logic circuit for preventing said rewriting of said data from being disturbed due to said condition.

29. A memory system as in claim 28 wherein said condition is selected from the group consisting of a power-up condition, a power-down condition, a brownout condition.

30. A memory system as in claim 28 wherein said logic circuit includes a data storage device for storing data to be rewritten into said memory cell, and said disturb prevention circuit comprises a circuit for preventing the loss of the data in said data storage device due to said condition.

31. A ferroelectric memory system comprising:
a power source for applying electrical power to said memory system;
a memory cell for holding data, said memory cell including a ferroelectric material; and
a disturb prevention circuit for preventing said data from being disturbed due to a condition in which said electrical power is unstable;
wherein: said power source comprises a source of a voltage; said memory system further includes a memory array and said memory cell is part of said memory array; said memory system further includes a logic circuit for applying an electrical signal to said memory array and a power-on-reset circuit for resetting said logic circuit when said voltage drops below an OFF threshold then rises to an ON threshold; and said disturb prevention circuit comprises a circuit for preventing said resetting of said logic circuit from causing loss of said data.

32. A memory system as in claim 31 wherein said source of a voltage includes a circuit for producing said voltage from a radio frequency source.

33. A ferroelectric memory system comprising:
a power source for applying electrical power to said memory system;
a memory cell for holding data, said memory cell including a ferroelectric material; and
a disturb prevention circuit for preventing said data from being disturbed due to a condition in which said electrical power is unstable;
wherein said memory system includes a timing signal generator and said disturb prevention circuit comprises a pause signal generating circuit for generating a pause signal for preventing said timing signal generator from outputting signals that could result in loss of said data.

34. A memory system as in claim 33 wherein said pause signal generating circuit comprises a circuit for generating said pause signal for a predetermined time.

35. A memory system as in claim 33 wherein said memory system includes a state machine and said disturb prevention circuit comprises a circuit for inhibiting said state machine from outputting signals that could result in loss of said data.

36. A ferroelectric memory system comprising:
a power source for applying electrical power to said memory system;
a memory cell for holding data, said memory cell including a ferroelectric material; and
a disturb prevention circuit for preventing said data from being disturbed due to a condition in which said electrical power is unstable;
wherein said memory system includes a data storage element and said disturb prevention circuit comprises a freeze circuit for freezing the data content of said data storage element while a predetermined signal is applied to said freeze circuit.

37. A memory system as in claim 28 wherein said disturb prevention circuit consists essentially of transistors, inverters, and other electronic elements that operate reliably at voltages significantly less than the supply voltage of said memory system.

38. A memory system as in claim 28 and further including a circuit for producing a system supply voltage from a radio frequency source.

39. A memory system as in claim 38 wherein said disturb prevention circuit comprises a circuit for preventing disturb voltages from being applied to said memory cell due to said condition.

40. A method of operating a destructive readout, nonvolatile memory having: a memory cell in which data is stored; and an electronic circuit selected from the group consisting of: a rewrite circuit for rewriting said data to said memory after it has been read; a data storage element for holding said data to be rewritten to said memory; and a power on reset circuit for resetting logic in said memory system when said voltage drops below an OFF threshold and then rises to an ON threshold; said method comprising the steps of:
sensing a low power condition of said memory; and
controlling at least one of said power source and said electronic circuits to Prevent unintended voltages produced by said low power condition from disturbing said data in said memory cell.

41. A method of operating a ferroelectric memory having a memory cell in which data is stored, and a conductor selected from the group consisting of a bit line and a plate line; said method comprising the steps of:
sensing a low power condition of said memory; and
preventing unintended voltages produced by said low power condition from being placed on said conductor.

42. A method as in claim 41 wherein said step of preventing comprises clamping said conductor to a predetermined voltage.

43. A method as in claim 41 wherein: said memory includes a logic circuit for applying a logic signal to said memory cell, and a memory array, said memory cell being part of said memory array; and said step of preventing comprises directing power to said logic circuit, and then after said logic circuit has reached an operating voltage, directing power to said memory array.

44. A method as in claim 41 wherein said step of preventing comprises:
receiving a memory control signal; and
disabling said memory signal for a time period in which said low power condition could cause said unintended voltages.

45. A method as in claim 41 wherein said memory includes a logic circuit for applying a signal to said memory cell, and said step of preventing comprises stopping the operation of said logic circuit for a time period in which said low power condition could cause said unintended voltages.

* * * * *